(12) United States Patent
Patterson et al.

(10) Patent No.: US 11,067,670 B2
(45) Date of Patent: Jul. 20, 2021

(54) HETEROGENEOUSLY INTEGRATED CHIP-SCALE LIDAR SYSTEM

(71) Applicant: GM Global Technology Operations LLC, Detroit, MI (US)

(72) Inventors: Pamela R. Patterson, Los Angeles, CA (US); Biqin Huang, Torrance, CA (US); James H. Schaffner, Chatsworth, CA (US); Keyvan Sayyah, Santa Monica, CA (US); Oleg Efimov, Thousand Oaks, CA (US); Raymond Sarkissian, Studio City, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 526 days.

(21) Appl. No.: 16/020,202

(22) Filed: Jun. 27, 2018

(65) Prior Publication Data

US 2019/0018114 A1    Jan. 17, 2019

Related U.S. Application Data

(60) Provisional application No. 62/531,414, filed on Jul. 12, 2017.

(51) Int. Cl.
*G01S 7/481* (2006.01)
*G01S 17/93* (2020.01)
(Continued)

(52) U.S. Cl.
CPC ............. *G01S 7/4815* (2013.01); *B81B 7/02* (2013.01); *G01S 7/4816* (2013.01);
(Continued)

(58) Field of Classification Search
CPC ...... G01S 7/4815; G01S 7/4911; G01S 17/58; G01S 17/42; G01S 17/34; G01S 17/86;
(Continued)

(56) References Cited

U.S. PATENT DOCUMENTS 5,139,879 A    8/1992  Aharoni
5,283,846 A    2/1994  Toyonaka
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — Daniel L Murphy
(74) *Attorney, Agent, or Firm* — Cantor Colburn LLP

(57) ABSTRACT

A lidar system includes a photonic chip including a light source and a transmit beam coupler to provide an output signal for transmission. The output signal is a frequency modulated continuous wave (FMCW) signal. A transmit beam steering device transmits the output signal from the transmit beam coupler of the photonic chip. A receive beam steering device obtains a reflection of the output signal by a target and provides the reflection as a received signal to a receive beam coupler of the photonic chip. The photonic chip, the transmit beam steering device, and the receive beam steering device are heterogeneously integrated into an optical engine.

20 Claims, 3 Drawing Sheets

(51) Int. Cl.

| | | |
|---|---|---|
| *G01S 7/491* | (2020.01) | |
| *G01S 7/4911* | (2020.01) | |
| *G01S 17/58* | (2006.01) | |
| *G01S 17/42* | (2006.01) | |
| *G01S 17/34* | (2020.01) | |
| *G01S 17/86* | (2020.01) | |
| *G01S 17/931* | (2020.01) | |
| *G01S 7/499* | (2006.01) | |
| *G01S 17/02* | (2020.01) | |
| *G02B 6/122* | (2006.01) | |
| *G02B 6/27* | (2006.01) | |
| *G02B 6/42* | (2006.01) | |
| *H01L 23/544* | (2006.01) | |
| *H01L 31/0232* | (2014.01) | |
| *H01L 31/16* | (2006.01) | |
| *G01S 17/00* | (2020.01) | |
| *G01S 17/32* | (2020.01) | |
| *G01S 7/4914* | (2020.01) | |
| *G01S 7/497* | (2006.01) | |
| *B81B 7/02* | (2006.01) | |
| *G02B 27/30* | (2006.01) | |
| *H01S 5/125* | (2006.01) | |
| *G01S 7/4913* | (2020.01) | |
| *G02B 6/00* | (2006.01) | |

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(58) Field of Classification Search
CPC ........ G01S 17/931; G01S 7/499; G01S 17/02; G01S 7/4817; G01S 7/4816; G01S 17/003; G01S 17/32; G01S 7/4914; G01S 7/491; G01S 7/4972; G01S 7/4818; G01S 7/4913; G02B 6/122; G02B 6/2766; G02B 6/4209; G02B 27/30; G02B 2006/0098; H01L 23/544; H01L 31/02327; H01L 31/16; H01L 2223/54426; H01L 2223/54486; B81B 7/02; B81B 2207/03; H01S 5/125
USPC ...................................................... 356/5.01
See application file for complete search history.

(56) References Cited

U.S. PATENT DOCUMENTS

| | | |
|---|---|---|
| 5,499,132 A | 3/1996 | Tojo |
| 6,122,110 A | 11/2000 | Park |
| 6,229,947 B1 | 5/2001 | Vawter |
| 6,480,331 B1 | 11/2002 | Cao |
| 6,962,345 B2 | 11/2005 | Inciong |
| 7,108,810 B2 | 9/2006 | Nakamura |
| 7,359,593 B2 | 4/2008 | Little |
| 7,481,588 B2 | 1/2009 | Monte |
| 8,116,602 B2 | 2/2012 | Little |
| 8,121,450 B2 | 2/2012 | Webster |
| 9,122,037 B2 | 9/2015 | Shastri |
| 9,310,471 B2 | 4/2016 | Sayyah |
| 9,335,480 B1 | 5/2016 | Celo |
| 9,575,162 B2 | 2/2017 | Owechko |
| 9,683,928 B2 * | 6/2017 | Swanson ................ G01N 21/39 |
| 10,886,437 B2 * | 1/2021 | Camras ............ C23C 16/45525 |
| 2001/0030807 A1 | 10/2001 | Ikari |
| 2002/0012167 A1 | 1/2002 | Wills |
| 2004/0070827 A1 | 4/2004 | Li |
| 2005/0018967 A1 | 1/2005 | Huang |
| 2005/0213979 A1 | 9/2005 | Nakashima |
| 2006/0002443 A1 | 1/2006 | Farber |
| 2010/0200898 A1 | 8/2010 | Lin |
| 2012/0152918 A1 | 6/2012 | Li |
| 2013/0209033 A1 | 8/2013 | Luff |
| 2015/0042992 A1 | 2/2015 | Cui |
| 2017/0153319 A1 | 6/2017 | Villeneuve |
| 2017/0184450 A1 | 6/2017 | Doylend |
| 2017/0336565 A1 | 11/2017 | Ryckman |
| 2017/0370676 A1 | 12/2017 | Volfson |
| 2018/0024299 A1 | 1/2018 | Leijtens |
| 2018/0284780 A1 * | 10/2018 | McWhirter ............ G05D 1/027 |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.

Winter et al., "Micro-beamer based on MEMS micro-mirrors and laser light source", Procedia Chemistry, vol. 1, Issue 1, 2009, pp. 1311-1314.

* cited by examiner

HETEROGENEOUSLY INTEGRATED CHIP-SCALE LIDAR SYSTEM

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to a heterogeneously integrated chip-scale lidar system.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal and relies on optical coherence between the transmitted signal and a return signal resulting from reflected scattering of the transmitted signal by a target to perform detection of the target. In applications, such as a vehicle application, a compact design of the sensor is important because of limited space availability. Accordingly, it is desirable to provide a heterogeneously integrated chip-scale lidar system.

SUMMARY

In one exemplary embodiment, a lidar system includes a photonic chip including a light source and a transmit beam coupler to provide an output signal for transmission, wherein the output signal is a frequency modulated continuous wave (FMCW) signal. The lidar system also includes a transmit beam steering device to transmit the output signal from the transmit beam coupler of the photonic chip, and a receive beam steering device to obtain a reflection of the output signal by a target and to provide the reflection as a received signal to a receive beam coupler of the photonic chip, wherein the photonic chip, the transmit beam steering device, and the receive beam steering device are heterogeneously integrated into an optical engine.

In addition to one or more of the features described herein, the transmit beam steering device and the receive beam steering device are two-dimensional microelectromechanical system (2D MEMS) mirrors fabricated as dies.

In addition to one or more of the features described herein, the optical engine is heterogeneously integrated on a semiconductor board with pockets etched for placement of the 2D MEMS mirrors.

In addition to one or more of the features described herein, the transmit beam steering device is placed to have optical alignment with the transmit beam coupler of the photonic chip, and the receive beam steering device is placed to have optical alignment with the receive beam coupler of the photonic chip.

In addition to one or more of the features described herein, the photonic chip, the transmit beam steering device, and the receive beam steering device are bonded to a common semiconductor board to passively maintain the optical alignment.

In addition to one or more of the features described herein, the lidar system also includes drive electronics coupled with the optical engine. The drive electronics include a modulating laser driver to modulate the light source and produce the FMCW signal and control drivers for the transmit beam steering device and the receive beam steering device.

In addition to one or more of the features described herein, the lidar system also includes post-detection electronics to process electrical signals provided by photodetectors of the photonic chip.

In addition to one or more of the features described herein, the optical engine, the drive electronics, and the post-detection electronics are formed on a first printed circuit board, and the control drivers are formed on a second printed circuit board.

In addition to one or more of the features described herein, the control drivers are fabricated as a first application specific integrated circuit (ASIC), and the drive electronics and the post-detection electronics are fabricated as a second ASIC.

In addition to one or more of the features described herein, the lidar system is in a vehicle.

In another exemplary embodiment, a method of packaging a lidar system includes fabricating a photonic chip. The photonic chip includes a light source and a transmit beam coupler to provide an output signal for transmission and the output signal is a frequency modulated continuous wave (FMCW) signal. The method also includes coupling a transmit beam steering device to the photonic chip to transmit the output signal from the transmit beam coupler of the photonic chip, and coupling a receive beam steering device to the photonic chip to obtain a reflection of the output signal by a target and to provide the reflection as a received signal to a receive beam coupler of the photonic chip. The photonic chip, the transmit beam steering device, and the receive beam steering device are heterogeneously integrated into an optical engine.

In addition to one or more of the features described herein, the method also includes fabricating the transmit beam steering device and the receive beam steering device as two-dimensional microelectromechanical system (2D MEMS) mirror dies, wherein the heterogeneously integrating the optical engine includes placing the 2D MEMS mirror dies in pockets etched in a silicon board.

In addition to one or more of the features described herein, the method also includes placing the transmit beam steering device to have optical alignment with the transmit beam coupler of the photonic chip, placing the receive beam steering device to have optical alignment with the receive beam coupler of the photonic chip, and passively bonding the photonic chip, the transmit beam steering device, and the receive beam steering device to a semiconductor board to maintain the optical alignment.

In addition to one or more of the features described herein, the method also includes coupling drive electronics with the optical engine, wherein the drive electronics include a modulating laser driver to modulate the light source and produce the FMCW signal and control drivers for the transmit beam steering device and the receive beam steering device, and coupling post-detection electronics to the optical engine to process electrical signals provided by photodetectors of the photonic chip.

In addition to one or more of the features described herein, the method also includes forming the optical engine, the drive electronics, and the post-detection electronics on a first printed circuit board and forming the control drivers on a second printed circuit board, or fabricating the control drivers as a first application specific integrated circuit (ASIC), and fabricating the drive electronics and the post-detection electronics as a second ASIC.

In yet another exemplary embodiment, a vehicle includes a lidar system that includes a photonic chip including a light source and a transmit beam coupler to provide an output signal for transmission. The output signal is a frequency modulated continuous wave (FMCW) signal. The lidar system also includes a transmit beam steering device to transmit the output signal from the transmit beam coupler of the photonic chip, and a receive beam steering device to obtain a reflection of the output signal by a target and to provide the reflection as a received signal to a receive beam coupler of the photonic chip. The photonic chip, the transmit beam steering device, and the receive beam steering device are heterogeneously integrated into an optical engine. The vehicle also includes a vehicle controller to augment or automate operation of the vehicle based on information from the lidar system.

In addition to one or more of the features described herein, the transmit beam steering device and the receive beam steering device are two-dimensional microelectromechanical system (2D MEMS) mirrors fabricated as dies, and the optical engine is heterogeneously integrated on a semiconductor board with pockets etched for placement of the 2D MEMS mirrors.

In addition to one or more of the features described herein, the transmit beam steering device is placed to have optical alignment with the transmit beam coupler of the photonic chip, the receive beam steering device is placed to have optical alignment with the receive beam coupler of the photonic chip, and the photonic chip, the transmit beam steering device, and the receive beam steering device are passively bonded to a semiconductor board to maintain the optical alignment.

In addition to one or more of the features described herein, the vehicle also includes drive electronics coupled with the optical engine. The drive electronics include a modulating laser driver to modulate the light source and produce the FMCW signal and control drivers for the transmit beam steering device and the receive beam steering device, and post-detection electronics to process electrical signals provided by photodetectors of the photonic chip.

In addition to one or more of the features described herein, the optical engine, the drive electronics and the post-detection electronics are formed on a first printed circuit board, and the control drivers are formed on a second printed circuit board, or the control drivers are fabricated as a first application specific integrated circuit (ASIC) and the drive electronics and the post-detection electronics are fabricated as a second ASIC.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
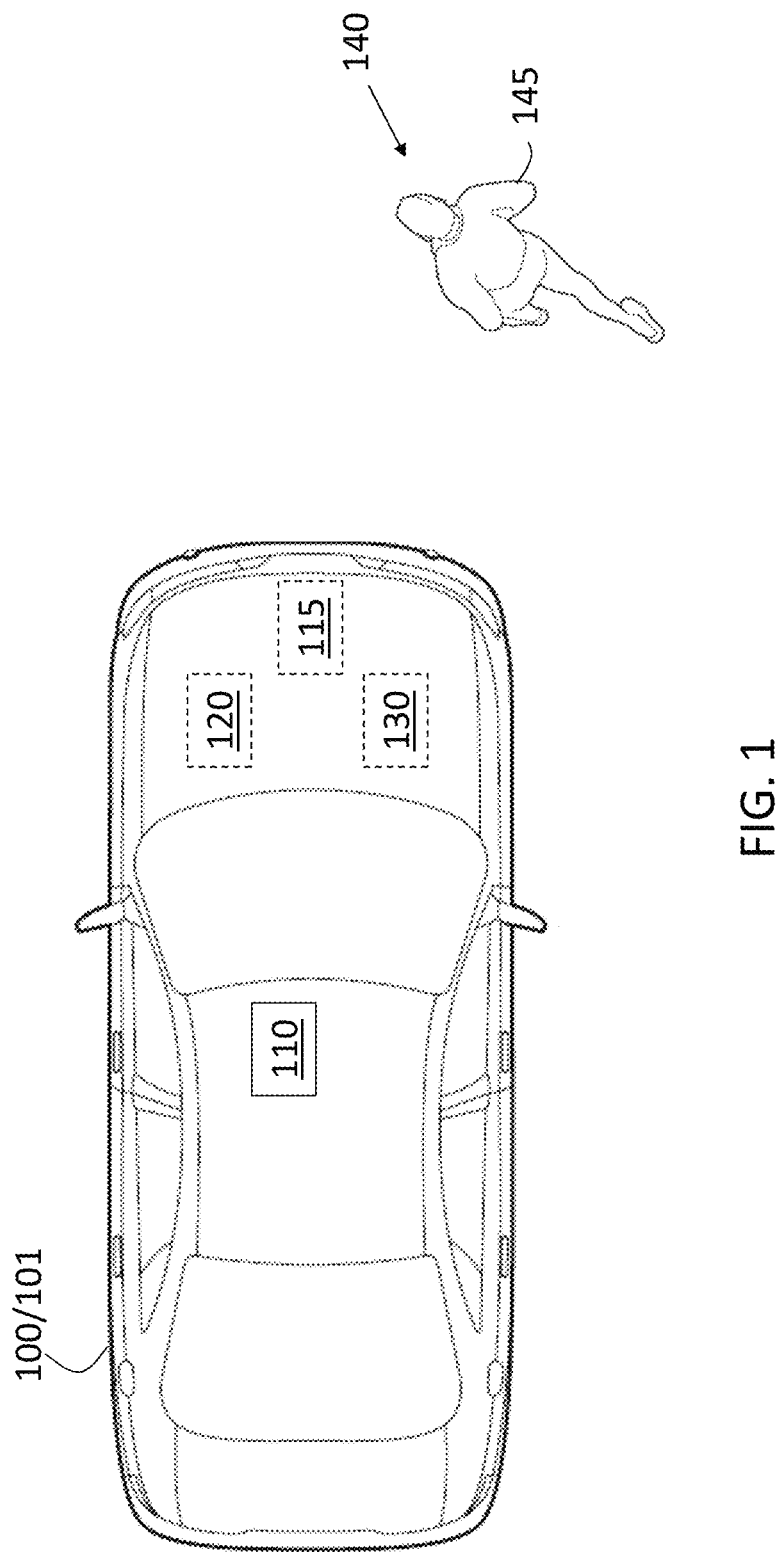
FIG. 1 is a block diagram of a scenario involving a chip-scale coherent lidar system according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a coherent lidar system is one of the sensors that may be used to augment or automate vehicle operation. In applications, such as the vehicle application, involving limited space for sensors and other systems, compactness is important. In addition, passive alignment of optical elements rather than an active alignment process based on a feedback increases efficiency and reduces the cost of the system. Embodiments of the systems and methods detailed herein relate to a heterogeneously integrated chip-scale lidar system. Heterogeneous integration refers to the assembly and packaging of separately manufactured components onto a single chip. According to one or more embodiments, a photonic chip and beam steering devices (e.g., two-dimensional microelectromechanical systems (MEMs) scanning micromirror dies) are heterogeneously integrated into an optical engine of the lidar system. In addition, drive electronics and post-detection electronics are packaged together with the optical engine on a printed circuit board or in an Application Specific Integrated Circuit (ASIC), for example, as a compact lidar system.

Figure 2:
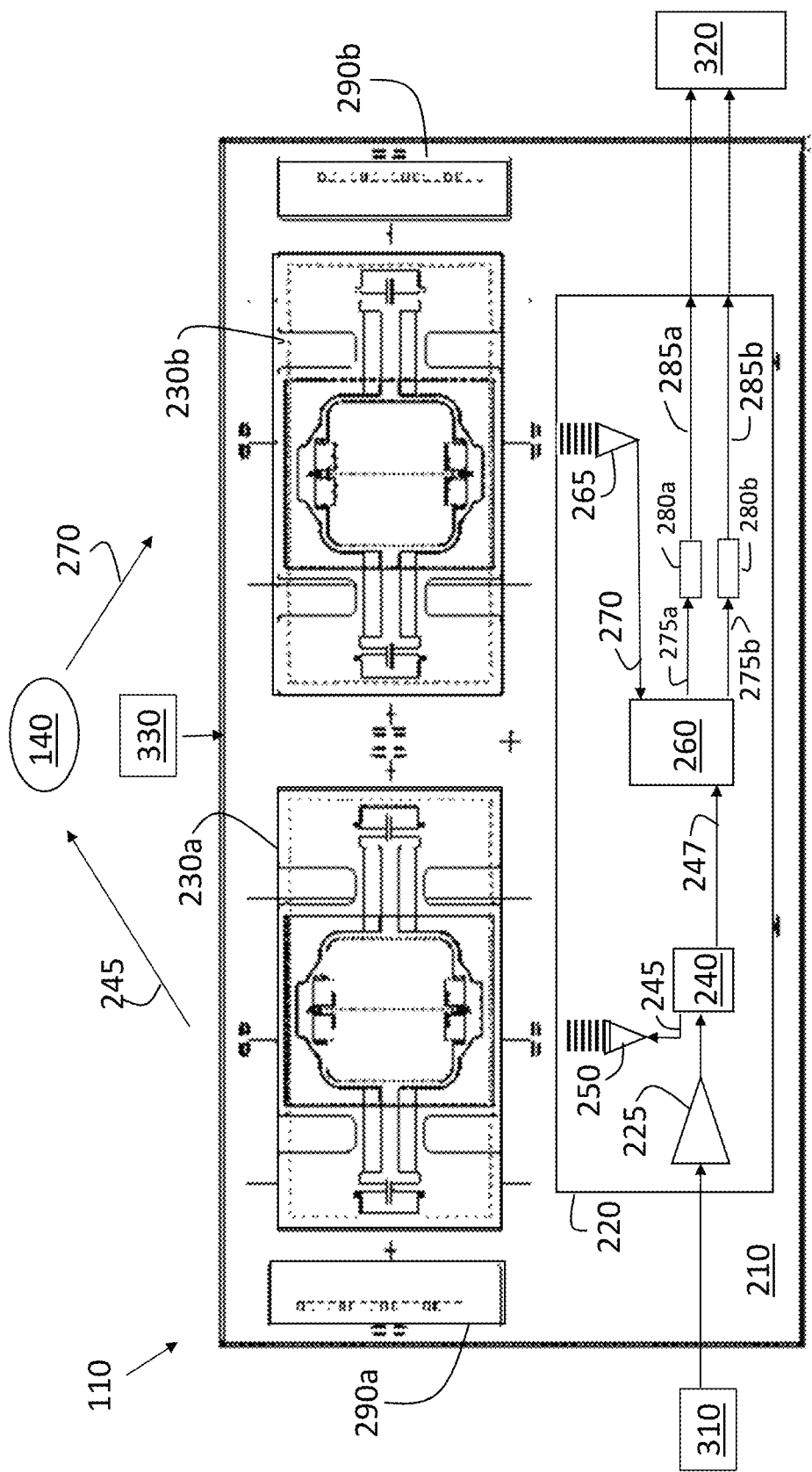
FIG. 2 is a block diagram detailing the photonic engine of the lidar system according to one or more embodiments.

In accordance with an exemplary embodiment, FIG. 1 is a block diagram of a scenario involving a chip-scale coherent lidar system 110. The vehicle 100 shown in FIG. 1 is an automobile 101. A coherent lidar system 110, further detailed with reference to FIG. 2, is shown on the roof of the automobile 101. According to alternate or additional embodiments, one or more lidar systems 110 may be located elsewhere on the vehicle 100. Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram detailing the photonic engine 210 of the lidar system 110 according to one or more embodiments. The photonic engine 210 results from heterogeneous integration of a photonic chip 220 with beam steering devices. Each exemplary beam steering device is a two-dimensional microelectromechanical systems (2D MEMS) micromirror dies. A 2D MEMS mirror 230a used for transmission and a 2D MEMS mirror 230b used for reception (generally referred to as 230) are shown. According to an exemplary embodiment, a nanometer-level precision process may be used to fabricate a semiconductor integration platform with pockets for attachment of the 2D MEMS mirrors 230. The process may include, for example, lithographic and dry etch techniques. The beam steering devices (e.g., 2D MEMS mirrors 230) are secured (e.g., bonded) on a semiconductor (e.g., silicon) board, for example, such that they are aligned with the photonic chip 220 that is also bonded on the semiconductor board. By passively aligning the 2D MEMS mirrors 230 with the photonic chip 220, the time-consuming active alignment process based on feedback control may be avoided.

The photonic chip 220 includes a light source 225 that is modulated by laser drive electronics 310 that is further discussed with reference to FIG. 3. The light source 225 is a laser diode according to exemplary embodiments. A frequency modulated continuous wave (FMCW) signal may be output by the light source 225 based on the modulation. A splitter 240 (e.g., waveguide splitter) divides the FMCW signal into an output signal 245 and a local oscillator (LO) signal 247 that is provided to combiner 260. The output signal 245 is provided to a transmit beam 250 (e.g., grating coupler, edge coupler) that is optically aligned with the 2D MEMS mirror 230a. The 2D MEMS mirror 230a directs the output signal 245 out of the lidar system 110. MEMS drivers and synchronization electronics 330 may be coupled to the optical engine 210 to control the 2D MEMS mirrors 230. Although they are shown separately in FIG. 2 for explanatory purposes, the laser drive electronics 310 and MEMS drivers and synchronization electronics 330 may be assembled together as drive electronics 340, as indicated in FIG. 3, according to an exemplary embodiment.

When the output signal 245 encounters a target 140, some of the light (i.e., output signal 245) that is dispersed by the target 140 is obtained by the 2D MEMS mirror 230b and provided to the receive beam coupler 265 (e.g., grating coupler, edge coupler) as a received signal 270. This received signal 270 is also provided to the combiner 260. Just as the transmit beam coupler 250 is optically aligned with the 2D MEMS mirror 230a, the receive beam coupler 265 is optically aligned with the 2D MEMS mirror 230b. The combination of the LO signal 247 and received signal 270 is split into combined signals 275a, 275b (generally referred to as 275) and provided, respectively, to photodetectors 280a, 280b (generally referred to as 280).

The received signal 270 and LO signal 247 in each combined signal 275 interfere in the corresponding photodetector 280 to generate electrical signals 285a, 285b (generally referred to as 285) that are also called beat signals. The two photodetectors 280 may be dual-balanced photodetectors used in accordance with a known balanced detector technique to cancel intensity noise in the LO signal 247 (which is caused by the light source 225 and, thus, is the same in the output signal 245) that is common to both photodetectors 280. The electrical signals 285 are provided to post-detection electronics 320 that is also detailed with reference to FIG. 3. The connectors 290a, 290b connect the photonic engine 210 to MEMS drivers and synchronization electronics 330 (FIG. 3).

Figure 3:
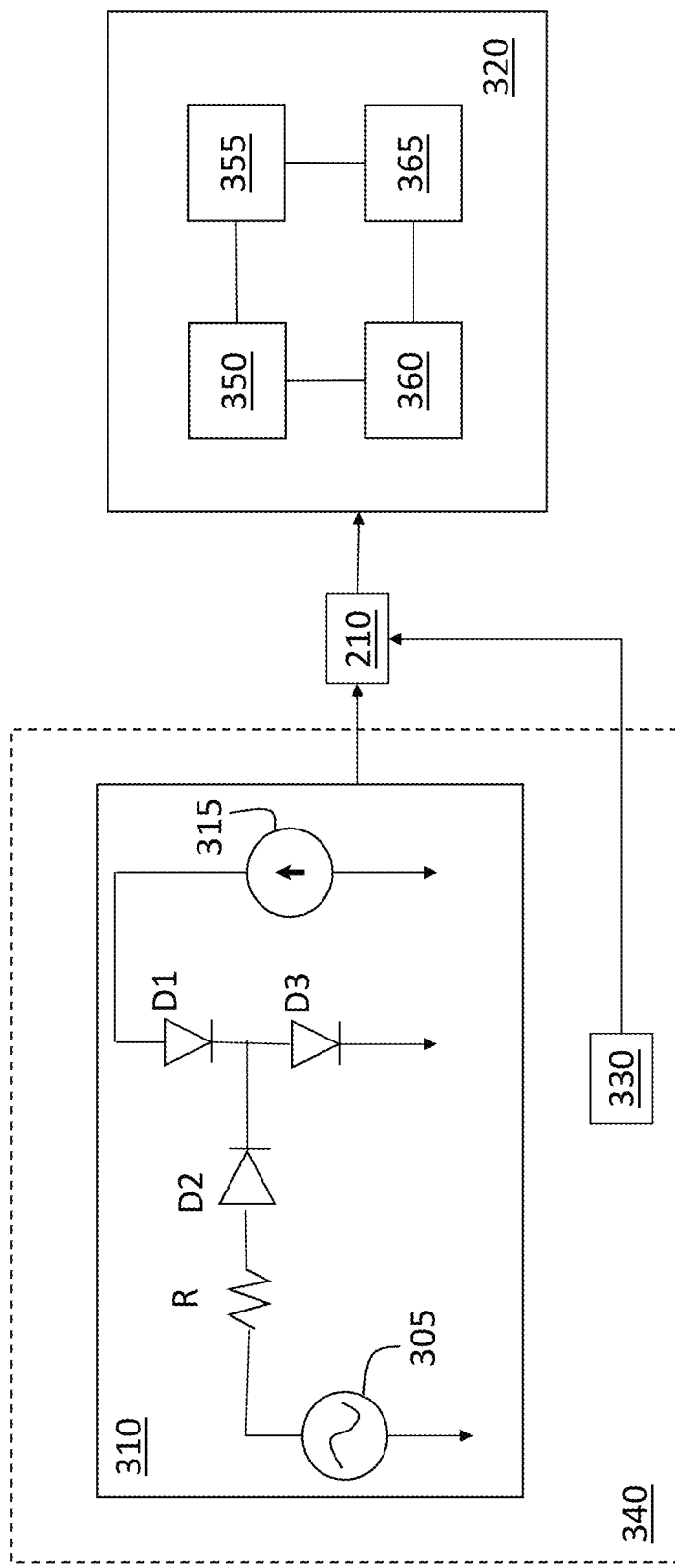
FIG. 3 is a block diagram detailing aspects of the lidar system 110 according to one or more embodiments.

FIG. 3 is a block diagram detailing aspects of the lidar system 110 according to one or more embodiments. Specifically, exemplary embodiments of the drive electronics 340 and post-detection electronics 320 that are integrated with the optical engine 210 are shown in more detail. The laser drive electronics 310 included in the drive electronics 340 modulate the light source 225, which is described with reference to FIG. 2 as being part of the photonic chip 220 of the photonic engine 210. The exemplary laser drive electronics 310 include a modulating voltage source 305, resistor R, diodes D1, D2, and D3, and a low-noise current source 315. The diode D3 is the laser diode.

The exemplary post-detection electronics 320 may be an autobalanced detector that includes a signal photodiode 350, a comparison photodiode 355, a transimpedance amplifier 360 that converts a differential current signal (based on electrical currents 285) generated by the two photodetectors 280 (FIG. 2) into a voltage signal with some gain, and integrating post amplifier 365 that further amplifies the generated voltage signal. As indicated in FIG. 2, the electrical currents 285 from each of the photodetectors 280, together with the 2D position data from the MEMS mirrors 230, are combined and processed by the post-detection electronics 320 to obtain three-dimensional information like range to the target 140 and the relative speed of the target 140 to the lidar system 110 as a function of two-dimensional spatial coordinates.

Additionally, as shown in FIG. 2, MEMS drivers and synchronization electronics 330 may drive the 2D MEMS mirrors 230 shown in FIG. 2. The drive electronics 340, optical engine 210, and post-detection electronics 320 of the lidar system 110 may be assembled on one printed circuit board according to an exemplary embodiment. According to an alternate embodiment, the laser drive electronics 310, optical engine 210, and post-detection electronics 320 may be assembled on one printed circuit board while the MEMS drivers and synchronization electronics 330 are on a second, stacked, printed circuit board. In another alternate embodiment, as previously noted, one or more ASICs may be fabricated with the drive electronics 340, the MEMS drivers and synchronization electronics 330, and post-detection electronics 320 of the lidar system 110. For example, the MEMS drivers and synchronization electronics 330 may be fabricated as an ASIC and the laser drive electronics 310 and post-detection electronics 320 may be fabricated as a second ASIC that is integrated with the heterogeneously integrated chip that includes the optical engine 210.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A lidar system, comprising:
 a photonic chip including a light source and a transmit beam coupler configured to provide an output signal for transmission, wherein the output signal is a frequency modulated continuous wave (FMCW) signal;
 a transmit beam steering device configured to transmit the output signal from the transmit beam coupler of the photonic chip; and
 a receive beam steering device configured to obtain a reflection of the output signal by a target and to provide the reflection as a received signal to a receive beam coupler of the photonic chip, wherein the photonic chip, the transmit beam steering device, and the receive beam steering device are heterogeneously integrated into an optical engine after the photonic chip, the transmit beam steering device, and the receive beam steering device are separately manufactured.

2. The lidar system according to claim 1, wherein the transmit beam steering device and the receive beam steering device are two-dimensional microelectromechanical system (2D MEMS) mirrors fabricated as dies.

3. The lidar system according to claim 2, wherein the optical engine is heterogeneously integrated on a semiconductor board with pockets etched for placement of the 2D MEMS mirrors.

4. The lidar system according to claim 1, wherein the transmit beam steering device is placed to have optical alignment with the transmit beam coupler of the photonic chip, and the receive beam steering device is placed to have optical alignment with the receive beam coupler of the photonic chip.

5. The lidar system according to claim 4, wherein the photonic chip, the transmit beam steering device, and the receive beam steering device are bonded to a common semiconductor board to passively maintain the optical alignment.

6. The lidar system according to claim 1, further comprising drive electronics coupled with the optical engine, wherein the drive electronics include a modulating laser driver to modulate the light source and produce the FMCW signal and control drivers for the transmit beam steering device and the receive beam steering device.

7. The lidar system according to claim 6, further comprising post-detection electronics configured to process electrical signals provided by photodetectors of the photonic chip.

8. The lidar system according to claim 7, wherein the optical engine, the drive electronics, and the post-detection electronics are formed on a first printed circuit board, and the control drivers are formed on a second printed circuit board.

9. The lidar system according to claim 7, wherein the control drivers are fabricated as a first application specific integrated circuit (ASIC), and the drive electronics and the post-detection electronics are fabricated as a second ASIC.

10. The lidar system according to claim 1, wherein the lidar system is in a vehicle.

11. A method of packaging a lidar system, the method comprising:
fabricating a photonic chip, wherein the photonic chip includes a light source and a transmit beam coupler to provide an output signal for transmission and the output signal is a frequency modulated continuous wave (FMCW) signal;
coupling a transmit beam steering device to the photonic chip to transmit the output signal from the transmit beam coupler of the photonic chip;
coupling a receive beam steering device to the photonic chip to obtain a reflection of the output signal by a target and to provide the reflection as a received signal to a receive beam coupler of the photonic chip; and
heterogeneously integrating the photonic chip, the transmit beam steering device, and the receive beam steering device into an optical engine following separate fabrication of the photonic chip, the transmit beam steering device, and the receive beam steering device.

12. The method according to claim 11, further comprising fabricating the transmit beam steering device and the receive beam steering device as two-dimensional microelectromechanical system (2D MEMS) mirror dies, wherein the heterogeneously integrating the optical engine includes placing the 2D MEMS mirror dies in pockets etched in a silicon board.

13. The method according to claim 11, further comprising placing the transmit beam steering device to have optical alignment with the transmit beam coupler of the photonic chip, placing the receive beam steering device to have optical alignment with the receive beam coupler of the photonic chip, and passively bonding the photonic chip, the transmit beam steering device, and the receive beam steering device to a semiconductor board to maintain the optical alignment.

14. The method according to claim 11, further comprising coupling drive electronics with the optical engine, wherein the drive electronics include a modulating laser driver to modulate the light source and produce the FMCW signal and control drivers for the transmit beam steering device and the receive beam steering device, and coupling post-detection electronics to the optical engine to process electrical signals provided by photodetectors of the photonic chip.

15. The lidar system according to claim 14, further comprising forming the optical engine, the drive electronics, and the post-detection electronics on a first printed circuit board and forming the control drivers on a second printed circuit board, or fabricating the control drivers as a first application specific integrated circuit (ASIC), and fabricating the drive electronics and the post-detection electronics as a second ASIC.

16. A vehicle, comprising:
a lidar system comprising:
a photonic chip including a light source and a transmit beam coupler configured to provide an output signal for transmission, wherein the output signal is a frequency modulated continuous wave (FMCW) signal;
a transmit beam steering device configured to transmit the output signal from the transmit beam coupler of the photonic chip; and
a receive beam steering device configured to obtain a reflection of the output signal by a target and to provide the reflection as a received signal to a receive beam coupler of the photonic chip, wherein the photonic chip, the transmit beam steering device, and the receive beam steering device are heterogeneously integrated into an optical engine after the photonic chip, the transmit beam steering device, and the receive beam steering device are separately manufactured; and
a vehicle controller configured to augment or automate operation of the vehicle based on information from the lidar system.

17. The vehicle according to claim 16, wherein the transmit beam steering device and the receive beam steering device are two-dimensional microelectromechanical system (2D MEMS) mirrors fabricated as dies, and the optical engine is heterogeneously integrated on a semiconductor board with pockets etched for placement of the 2D MEMS mirrors.

18. The vehicle according to claim 16, wherein the transmit beam steering device is placed to have optical alignment with the transmit beam coupler of the photonic chip, the receive beam steering device is placed to have optical alignment with the receive beam coupler of the photonic chip, and the photonic chip, the transmit beam steering device, and the receive beam steering device are passively bonded to a semiconductor board to maintain the optical alignment.

19. The vehicle according to claim 16, further comprising drive electronics coupled with the optical engine, wherein the drive electronics include a modulating laser driver to modulate the light source and produce the FMCW signal and control drivers for the transmit beam steering device and the receive beam steering device, and post-detection electronics configured to process electrical signals provided by photo-detectors of the photonic chip.

20. The vehicle according to claim 19, wherein the optical engine, the drive electronics and the post-detection electronics are formed on a first printed circuit board, and the control drivers are formed on a second printed circuit board, or the control drivers are fabricated as a first application specific integrated circuit (ASIC) and the drive electronics and the post-detection electronics are fabricated as a second ASIC.

* * * * *